United States Patent
Kojima et al.

[11] Patent Number: 5,953,247
[45] Date of Patent: Sep. 14, 1999

[54] DRAM WITH DUMMY WORD LINES

[75] Inventors: Hideyuki Kojima; Toshiya Uchida, both of Kawasaki, Japan

[73] Assignee: Fujitsu Limited, Kawasaki, Japan

[21] Appl. No.: 09/222,175

[22] Filed: Dec. 29, 1998

[30] Foreign Application Priority Data

Aug. 6, 1998 [JP] Japan .................................. 10-223084

[51] Int. Cl.[6] .................................................. G11C 11/24
[52] U.S. Cl. ........................ 365/149; 365/210; 365/185.2; 365/185.23
[58] Field of Search ................................ 365/149, 185.2, 365/185.23, 210

[56] References Cited

U.S. PATENT DOCUMENTS

| | | | |
|---|---|---|---|
| 4,612,565 | 9/1986 | Shimizu et al. ........................ | 365/186 |
| 4,830,977 | 5/1989 | Katto et al. .................................. | 437/52 |
| 5,017,507 | 5/1991 | Miyazawa ................................. | 437/162 |
| 5,264,712 | 11/1993 | Murata et al. ............................. | 257/71 |

*Primary Examiner*—David Nelms
*Assistant Examiner*—Tuan T. Nguyen
*Attorney, Agent, or Firm*—Armstrong, Westerman, Hattori, McLeland & Naughton

[57] ABSTRACT

A plurality of word lines are disposed on the surface of a semiconductor substrate in a first direction. Two dummy word lines are disposed outside of the outermost word line among the word lines. MISFETs are disposed in correspondence with the word lines and dummy word lines. MISFETs are regularly disposed in the first direction and in a second direction crossing the first direction. One storage region among the source and drain regions of each MISFET is formed with a storage contact hole. The storage regions are distributed only in an area inside of the outermost dummy word line among the dummy word lines. A capacitor is connected to the storage region at the bottom of each storage contact hole. Different voltages are applied to the dummy word lines and the bit regions disposed outside of the outermost dummy word line. A semiconductor device capable of suppressing a standby current error is provided.

9 Claims, 9 Drawing Sheets

5,953,247

DRAM WITH DUMMY WORD LINES

This application is based on Japanese patent application HEI 10-223084 filed on Aug. 6, 1998, the whole contents of which are incorporated herein by reference.

BACKGROUND OF THE INVENTION a) Field of the Invention

The present invention relates to semiconductor devices having MISFETs regularly disposed in a substrate plane.

b) Description of the Related Art

Conventional technologies will be described by taking dynamic random access memories (DRAM) as an example.

FIG. 8 is a schematic plan view of a conventional DRAM. A plurality of word lines 100 are disposed at an equal interval on the surface of a semiconductor substrate, extending along a column direction in FIG. 8. A single dummy word line 101 is disposed on the outer side of the outermost word line 100, extending in the column direction.

A plurality of MISFETs 105 are disposed at positions corresponding to those of the word lines 100 and dummy word line 101. These MISFETs are regularly disposed in the row and column directions. The word lines 100 and dummy word line 101 also serve as the gate electrodes of corresponding MISFETs 105.

Two word lines 100 extend over one active region 104 in which two MISFETs 105 are formed. An interlayer insulating film is formed over the substrate, covering MISFETs 105. A storage contact hole 110 is formed through the interlayer insulating film, for each of storage regions at opposite ends of each active region 104 among the source/drain regions of MISFETs 105. A capacitor is formed in each storage contact hole 110. One electrode of the capacitor is connected to the corresponding storage region 106, and the other electrode constitutes a common electrode of all capacitors.

It is preferable that the storage contact hole 110 is made as large as possible in order to increase a static capacitance of the capacitor. To this end, the storage contact hole 110 is disposed partially overlapping the word line, as viewed along a direction normal to the substrate surface. The capacitor formed in the storage contact hole 110 is electrically insulated from the word line by an insulating film.

Of the source/drain regions of each pair of MISFETs 105, a bit region 107 at the center of the active region 104 is shared by these two MISFETs. A bit contact hole 111 is formed through the interlayer insulating film, for each of the bit regions 107. A bit line 108 extending in the row direction is formed on the interlayer insulating film, in correspondence with each row of bit contact holes. The bit region 107 is connected via a corresponding bit contact hole 111 to the bit line 108.

The word line 100 is connected to a word driver circuit 120. The word driver circuit 120 selectively applies an electrical signal to each word line. More specifically, a voltage Vii is applied to the word line 10 from which column information is read, and a ground voltage Vss is applied to the other word lines 100. The dummy word line 101 is supplied with the ground potential Vss which makes MISFET 105a connected to the dummy word line 101 electrically non-conductive.

An outermost impurity diffusion region 125 extending in the column direction is formed outside of the dummy word line 101 in the substrate surface layer. This outermost impurity diffusion region 125 also functions as the storage region of MISFET 105a corresponding to the dummy word line 101. For example, a voltage Vii/2, which is a half of the Vii applied to the word line 100, is applied to the outermost impurity diffusion region 125. The outermost impurity diffusion region 125 traps electrons generated by the operations of transistors in a peripheral circuit and prevents the electrons from being diffused into the memory cell region.

Each bit line 108 is connected to a sense amplifier circuit 130. The sense amplifier circuit 130 is disposed outside of the outermost impurity diffusion region 125. The sense amplifier circuit 130 detects a voltage on the bit line 108. A bit line 108a on the outermost side (uppermost row in FIG. 8) is not connected to the sense amplifier circuit 130 but is used as a dummy bit line.

The outermost word and bit lines are therefore used as dummy lines. MISFETs corresponding to the dummy word and bit lines do not operate as memory cells. This layout of dummy word and bit lines allows the pattern of regions functioning as actual memory cells to be formed stably.

From the same reason as above, a storage contact hole 110a is also formed above the storage region of MISFET 105a corresponding to the dummy word line 101. Along a bit line 108b at the second row in FIG. 8, a storage contact hole 110b is formed riding on the dummy word line 101 and the outermost impurity diffusion region 125.

FIG. 9 is a cross sectional view taken along one-dot chain line A9—A9. On the surface of the p-type silicon substrate 150, a field oxide film 151 is formed. In a surface layer of an active region defined by the field oxide film 151, the outermost impurity diffusion region 125 is formed having a n-type conductivity doped with phosphorous (P).

The dummy word line 101 is formed on the field oxide film 151 in an area near its end. The dummy word line 101 is a lamination of a polysilicon film 101a and a WSi film 101b. An upper insulating film 152 made of $SiO_2$ is formed on the WSi film 101b. Side wall insulating films 153 made of $SiO_2$ are formed on the side walls of the lamination structure of the dummy word line 101 and upper insulating film 152. Namely, the upper side surfaces of the dummy word line 101 are covered with the upper insulating film 152 and side wall insulating film 153 both made of $SiO_2$.

A protective film 155 made of $SiO_2$ is formed covering the upper insulating film 152, side wall insulating films 153, and outermost impurity diffusion region 125. On this protective film 155, an etching stopper film 156 made of SiN is formed. On the etching stopper film 156, an interlayer insulating film 157 made of borophosphosilicate glass (BPSG) is formed. The surface of the interlayer insulating film 157 is planarized by chemical mechanical polishing (CMP).

The storage contact hole 110b is formed through the interlayer insulating film 157 to expose the surface of the outermost impurity diffusion region 125. The storage contact hole 110b extends over a partial area of the dummy word line 101. Etching the interlayer insulating film 157 can be stopped with high reproductivity by the etching stopper film 156 made of SiN.

The etching stopper film 156 exposed on the bottom of the storage contact hole 110b is removed. While the etching stopper film 156 is removed, the protective film 155 made of $SiO_2$ protects the outermost impurity diffusion region 125. The protective film 155 exposed on the bottom of the storage contact hole 110b is finally removed.

A storage electrode 160 made of polysilicon is formed on the bottom and side surfaces of the storage contact hole 110b. The surface of the storage electrode 160 and the upper surface of the interlayer insulating film 162 are covered with a dielectric film 161 made of SiN. The surface of the dielectric film 161 may be oxidized to form a thin SiO film on the surface thereof. A common electrode 162 made of polysilicon is formed on the surface of the dielectric film 161.

The dummy word line 101 and storage electrode 160 are electrically separated by the upper insulating film 152 and side wall insulating films 153. However, if the storage contact hole 110b is over-etched, the dummy word line 101 and storage electrode 160 may contact each other. In this case, the dummy word line 101 and outermost impurity diffusion region 125 are shorted via the storage electrode 160. Since the ground potential Vss is applied to the dummy word line 101 and the voltage Vss/2 is applied to the outermost impurity diffusion region 125, current always flows when both are shorted. In this case, even if the memory cell region has no bit error, a standby current error occurs.

SUMMARY OF THE INVENTION

It is an object of the present invention to provide a semiconductor device capable of suppressing occurrent of a standby current error.

According to one aspect of the present invention, there is provided a semiconductor device comprising: a semiconductor substrate; a plurality of word lines disposed at a predetermined interval on a surface of the semiconductor substrate and extending in a first direction; at least two dummy word lines disposed at a predetermined space and extending in the first direction, the dummy word lines being disposed in an area outside of an outermost word line of the plurality of word lines; a plurality of MISFETs formed in correspondence with each of the word lines and the dummy word lines and regularly disposed in the first direction and in a second direction crossing the first direction, the word line or dummy word line of each MISFET serving also as a corresponding gate electrode of each MISFET; an interlayer insulating film covering the MISFETs; storage contact holes formed through the interlayer insulating film, each being disposed in one storage region among source and drain regions of each MISFET, the storage regions being distributed only in an area inside of an outermost dummy word line among the dummy word lines; a capacitor formed on a bottom of each storage contact hole in each of the storage regions; a word driver circuit connected to the word lines for selectively applying an electrical signal to each of the word lines; a first voltage application circuit for applying a first fixed voltage to the dummy word lines; and a second voltage application circuit for applying a second fixed voltage different from the first fixed voltage to each bit region, disposed outside of the outermost dummy word line, among the source and drain regions of each MISFET corresponding to the outermost dummy word line.

The storage regions are distributed only in the region inner than an outer side dummy word line. Therefore, even if the storage contact hole is over-etched and the dummy word line is exposed, the bit region disposed outside of the outer dummy word line and the dummy word line are not shorted via the capacitor. It is therefore possible to prevent a steady current from flowing between first and second fixed voltages. A manufacture yield of semiconductor devices can be improved.

DETAILED DESCRIPTION OF THE PREFERRED EMBODIMENTS

Figure 1:
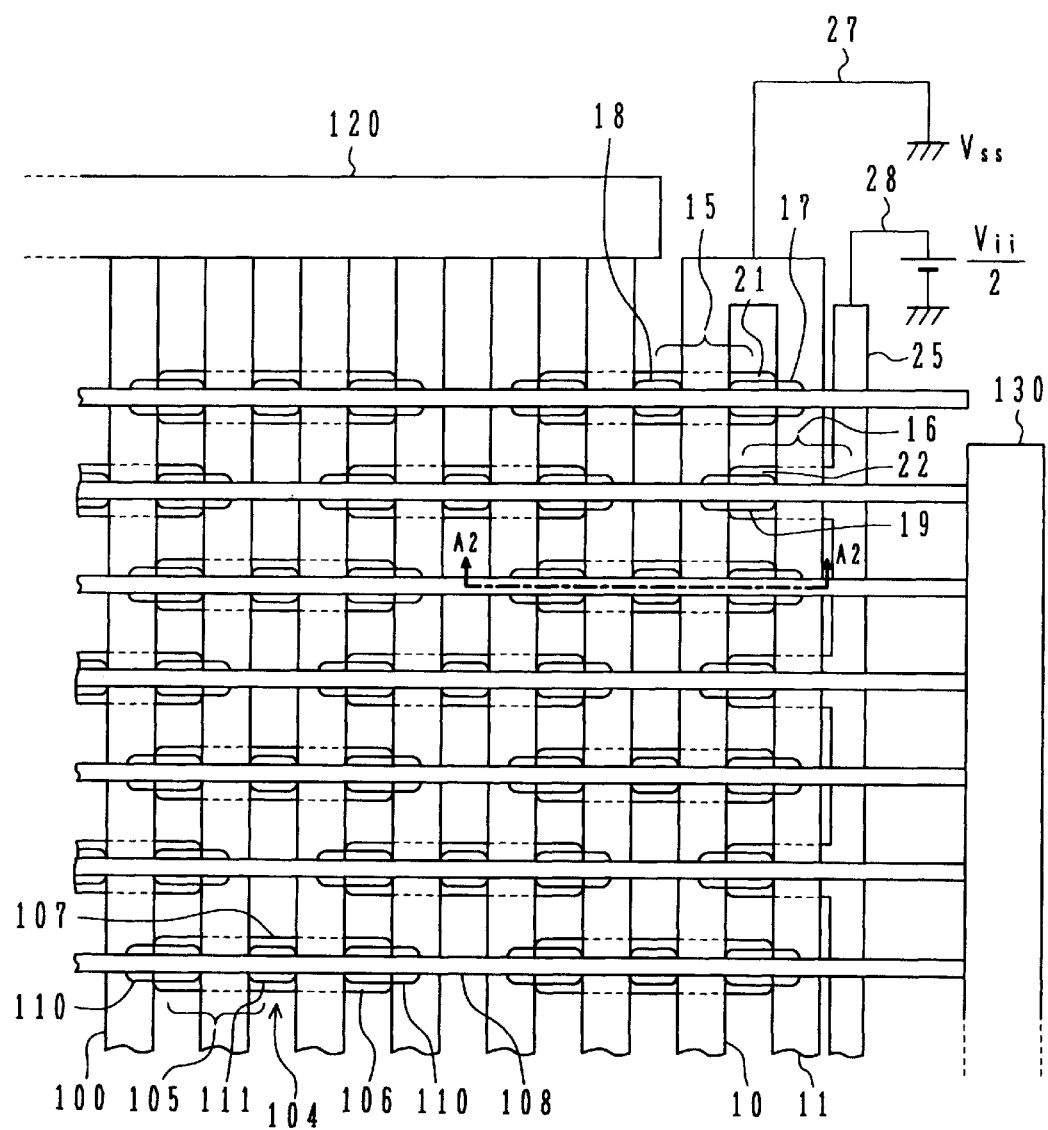
FIG. 1 is a schematic plan view of a semiconductor device according to a first embodiment of the invention.

FIG. 1 is a schematic plan view of a semiconductor device according to the first embodiment of the invention. A plurality of word lines 100 extend in the column direction (vertical direction) in FIG. 1, and a plurality of bit lines 108 extend in the row direction (horizontal direction). MISFETs 105 are disposed at cross points of the word lines 110 and bit lines 108. More specifically, in the (2×i)-th bit line 108, MISFETs 105 are disposed at positions corresponding to the (4×j)-th and (4×j+3)-th column word lines, and in the (2×i+1)-th bit line 108, MISFETs 105 are disposed at positions corresponding to the (4×j+1)-th and (4×j+2)-th column word lines, where i, j=0, 1, 2, 3, . . . (i and j in the specification to follow are the same).

The gate electrode of MISFET 105 is the corresponding word line 100. A storage contact hole 110 is disposed at one storage region 106 of the source/drain regions of each MISFET 105, and a bit contact hole 111 is disposed at the other bit region. Each word line 100 is connected to a word driver circuit 120, and each bit line 108 is connected to a sense amplifier circuit 130. The structures of the word driver circuit 120 and sense amplifier circuit 130 are similar to a conventional semiconductor device, and the detailed description thereof is omitted.

A dummy word line 10 is disposed outside of an outermost word line of the plurality of word lines 100, and another dummy word line 11 is disposed outside of the dummy word line 10. MISFET 15 is disposed at each of cross points between the dummy word line 10 and (2×i)-th bit lines 108, and MISFET 16 is disposed at each of cross points between the dummy word line 11 and (2×i+1)-th bit lines 108.

A storage region 21 of MISFET 15 and a storage region 22 of MISFET 16 are disposed between the two dummy word lines 10 and 11. Namely, the storage regions 106, 21, and 22 of MISFETs 105, 15, and 16 are disposed only inside of the outer dummy word line 11. Storage contact holes 17 and 19 corresponding to the storage regions 21 and 22 are disposed partially overlapping the dummy word lines 11 and 10.

A bit contact hole 18 corresponding to MISFET 15 is disposed between the dummy word line 10 and the word line 100 inside of the dummy word line 10.

An outermost impurity diffusion region 25 doped with phosphorous (P) is disposed in a surface layer of the silicon substrate in an area outside of the outer dummy word line 11. The outermost impurity diffusion region 25 extends in the column direction along the dummy word line 11 and also functions as the bit regions of MISFETs 16. However, a bit contact hole corresponding to the bit region of MISFET 16 is not formed.

A ground potential Vss is applied from a first voltage application circuit 27 to the dummy word lines 10 and 11. The ground potential Vss has a gate voltage level which makes MISFETs 15 and 16 corresponding to the dummy word lines 10 and 11 electrically non-conductive. A voltage Vii/2 which is a half of a read voltage Vii is applied from a second voltage application circuit 28 to the outermost impurity diffusion region 15. The read voltage Vii has a voltage level capable of reading the contents of each memory cell.

Since MISFETs 15 and 16 are made electrically nonconductive, the storage regions 21 and 22 disposed between the dummy word lines 10 and 11 are in a d.c. floating state. Therefore, even if the storage contact holes 17 and 19 are over-etched and the dummy word line 10 and storage region 22 or the dummy word line 11 and storage region 21 are shorted, a d.c. steady current will not flow therebetween. Since the storage contact hole 106 and bit contact hole 111 are not formed in the outermost impurity diffusion region 25, it is possible to prevent the dummy word line 11 and outermost impurity diffusion region 25 from being shorted. A standby current error can therefore be prevented and a manufacture yield can be improved.

Next, with reference to FIGS. 2A to 4B, a method of manufacturing the semiconductor device shown in FIG. 1 will be described. FIGS. 2A to 4B are cross sectional views taken along one-dot chain line A2—A2 shown in FIG. 1.

Figure 2A:
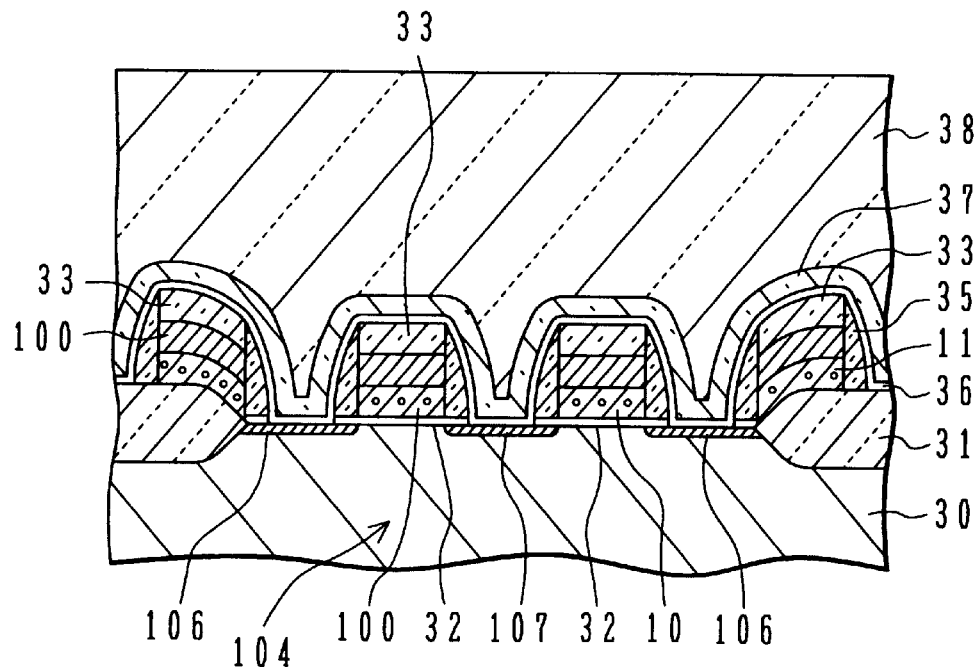
FIGS. 2A, 2B, 3A, 3B, 4A, and 4B are cross sectional views of a semiconductor device illustrating a method of manufacturing the semiconductor device of the first embodiment.

As shown in FIG. 2A, a p-type silicon substrate 30 has a field oxide film 31 formed on the surface thereof and defining an active region 104. A word line 100 and a dummy word line 10 extend on the active region 104 in a direction perpendicular to the drawing sheet. Another word line 100 and another dummy word line 11 extend on the right and left field oxide films 31 in the direction perpendicular to the drawing sheet.

The word lines 100 and 10 on the active region 104 have a gate oxide film 32 formed thereunder. The word line 100 and dummy word lines 10 and 11 each have a two-layer structure of a polysilicon film and a WSi film. The word line 100 and dummy word lines 10 and 11 have an upper insulating film 33 made of $SiO_2$ and formed thereon. The structure described above can be formed by known techniques of local oxidation of silicon (LOCOS), thermal oxidation, chemical vapor deposition (CVD), photolithography, and reactive ion etching (RIE).

By using the word line 100 and dummy word lines 10 and 11 as a mask, phosphorous (P) ions are implanted into the surface layer of the active region 104. For example, this ion implantation is performed under the conditions of an acceleration energy of 20 keV and a dose of $2.5 \times 10^{13}$ $cm^{-2}$. With this ion implantation, impurity diffusion regions are formed on both sides of the word line 100 and dummy word line 10. The impurity diffusion regions at opposite ends in FIG. 2A are storage regions 106, and a central impurity diffusion region is a bit region 107.

Side wall insulating films 35 made of $SiO_2$ are formed on side walls of lamination structures each being constituted of one of the word line 100 and dummy word lines 10 and 11, and the upper insulating film 33. The side wall insulating film 35 can be formed by depositing an $SiO_2$ film on the whole surface of the substrate and anisotropically etching the $SiO_2$ film.

A protective film 36 made of $SiO_2$ and having a thickness of about 20 nm is deposited by CVD over the whole surface of the substrate. An etching stopper film 37 made of SiN and having a thickness of about 70 nm is formed by CVD on the surface of the protective film 36. An interlayer insulating film 38 made of BPSG and having a thickness of about 1.75 $\mu$m is deposited on the surface of the etching stopper film 37. After the interlayer insulating film 38 is deposited, its surface is planarized by CMP.

Figure 2B:
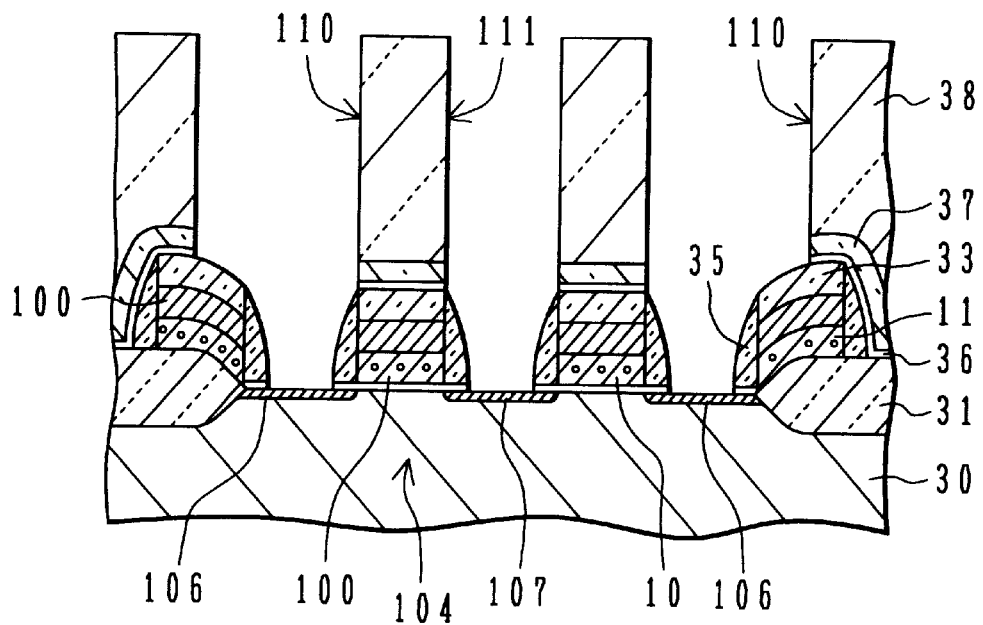

As shown in FIG. 2B, storage contact holes 110 are formed through the interlayer insulating film 38 in areas corresponding to the storage regions 108, and a bit contact hole 111 is formed in an area corresponding to the bit region 107. A method of forming the storage contact hole 110 and bit contact hole 111 will be described in the following.

An area not formed with contact holes is covered with a resist pattern. The interlayer insulating film 38 is etched under the conditions that the etching stopper film 37 made of SiN is etched at a sufficiently slow rate and the interlayer insulating film 38 made of BPSG is etched at a fast rate. An etching method may be RIE using $C_4F_8/Ar/O_2/CO$. With this method, the etching can be stopped with high reproductivity when the surface of the etching stopper film 37 is exposed.

Next, the etching stopper film 37 is etched under the conditions that the protective film 36 made of $SiO_2$ is etched at a sufficiently slow rate and the etching stopper layer 37 made of SiN is etched at a fast rate. An etching method may be RIE using $CHF_3/O_2$. In this case, since the surfaces of the storage regions 106 and bit region 107 are covered with the protective films 36, damages of the surfaces can be reduced. After the etching stopper film 37 is removed, the protective films 36 exposed on the bottoms of the contact holes are removed through wet etching, and lastly the resist pattern is removed.

Etching the interlayer insulating film 38 is stopped by the etching stopper film 37, and etching the etching stopper film 37 is stopped by the protective film 36. Since the protective film 36 is sufficiently thinner than the upper insulating film 33 and side wall insulating film 35, the latter films can be left at high reproductivity when the protective film 36 is etched. Therefore, even if the storage contact hole 110 partially overlaps the word line 100 or dummy word line 11, the storage contact hole 110 can be formed without exposing the word line 100 or dummy word line 11. Even if there is a misalignment of the contact hole, the word line 100 and dummy word lines 10 and 11 can be prevented from being exposed.

Figure 3A:
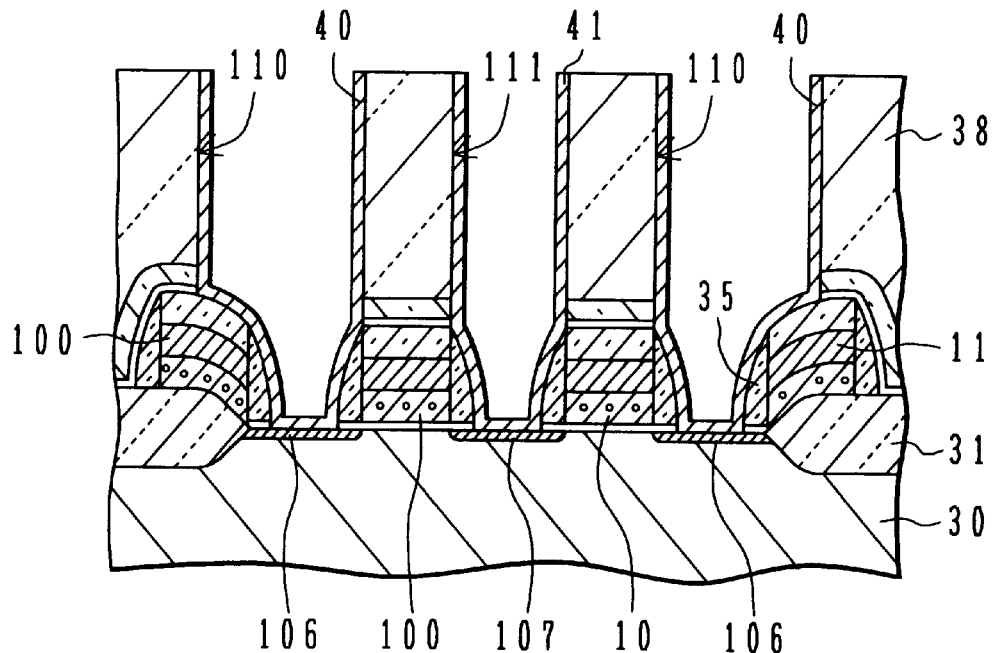

As shown in FIG. 3A, storage electrodes 40 made of phosphorus doped amorphous silicon are formed on the inner surfaces of the storage contact holes 110, and an amorphous silicon film 41 is formed on the inner surface of the bit contact hole 111. A method of forming the storage electrode 40 and amorphous silicon film 41 will be described in the following.

An amorphous silicon film doped with phosphorous (P) is deposited by CVD to a thickness of 50 nm over the whole surface of the substrate including the inner surfaces of the storage contact holes 110 and bit contact hole 111. A resist film is coated filling the insides of the storage contact holes 110 and bit contact hole 111. CMP is performed until the surface of the interlayer insulating film 38 is exposed. The resist films left in the contact holes are removed. In the above manner, the storage electrodes 40 and amorphous silicon film 41 can be formed only on the inner surfaces of the contact holes 110 and 111.

Figure 3B:
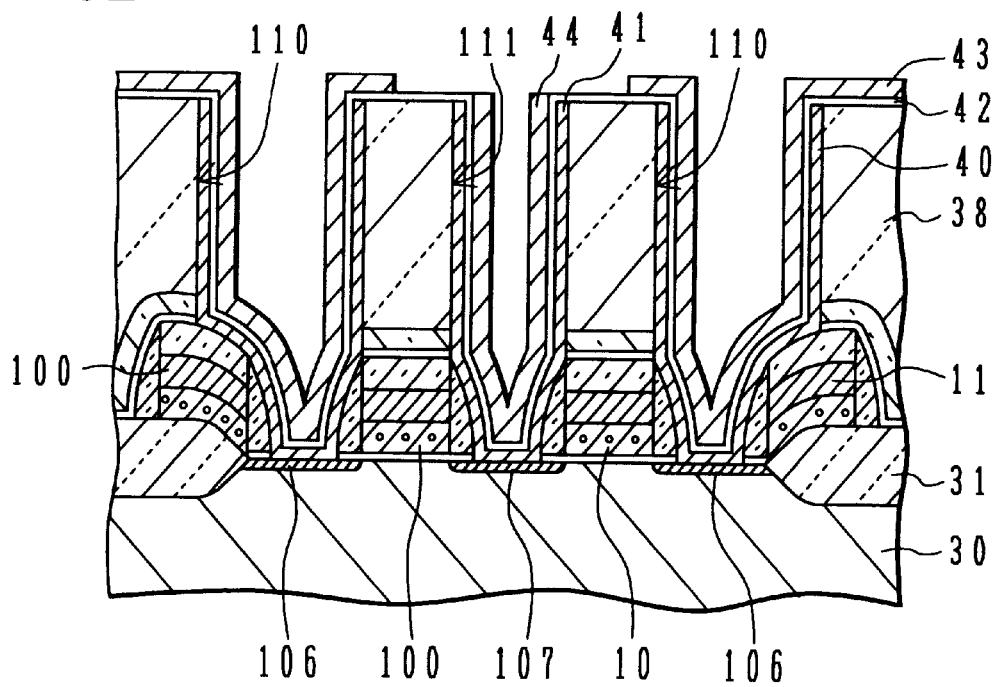

As shown in FIG. 3B, a dielectric film 42 made of SiN and having a thickness of 5.5 nm is deposited by CVD over the whole surface of the substrate. A surface layer of the dielectric film 42 is thinly oxidized. An amorphous silicon film doped with phosphorous (P) and having a thickness of 100 nm is deposited by CVD on the surface of the dielectric film 42. A portion of the amorphous silicon film near the bit contact hole 111 is removed. A common electrode 43 made of amorphous silicon is therefore left in the storage contact holes 110 and on the flat top surfaces. A capacitor constituted of the storage electrode 40, dielectric film 42, and common electrode 43 is therefore formed in each storage contact hole 110. The amorphous film 44 is left in the bit contact hole 111.

Figure 4A:
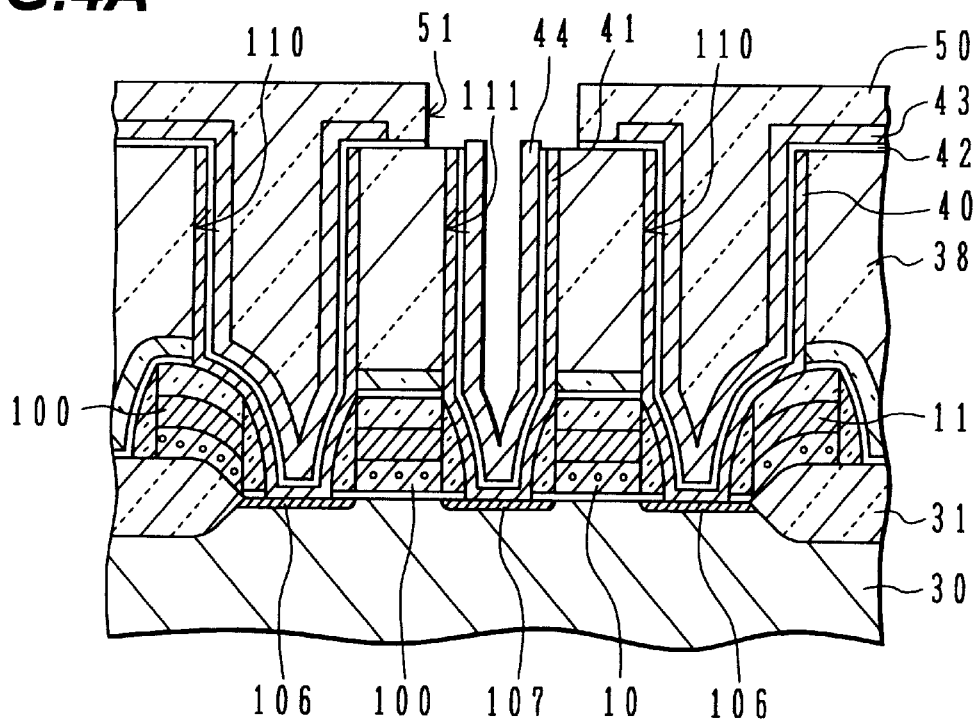

As shown in FIG. 4A, an interlayer insulating film 50 made of $SiO_2$ is deposited by CVD on the whole surface of the substrate. An opening 51 is formed through the interlayer insulating film 50 to expose the bit contact hole 111. In this case, the dielectric film 42 exposed in the opening 51 is removed. A top edge of the amorphous silicon film 41 is therefore exposed in the opening 51.

Figure 4B:
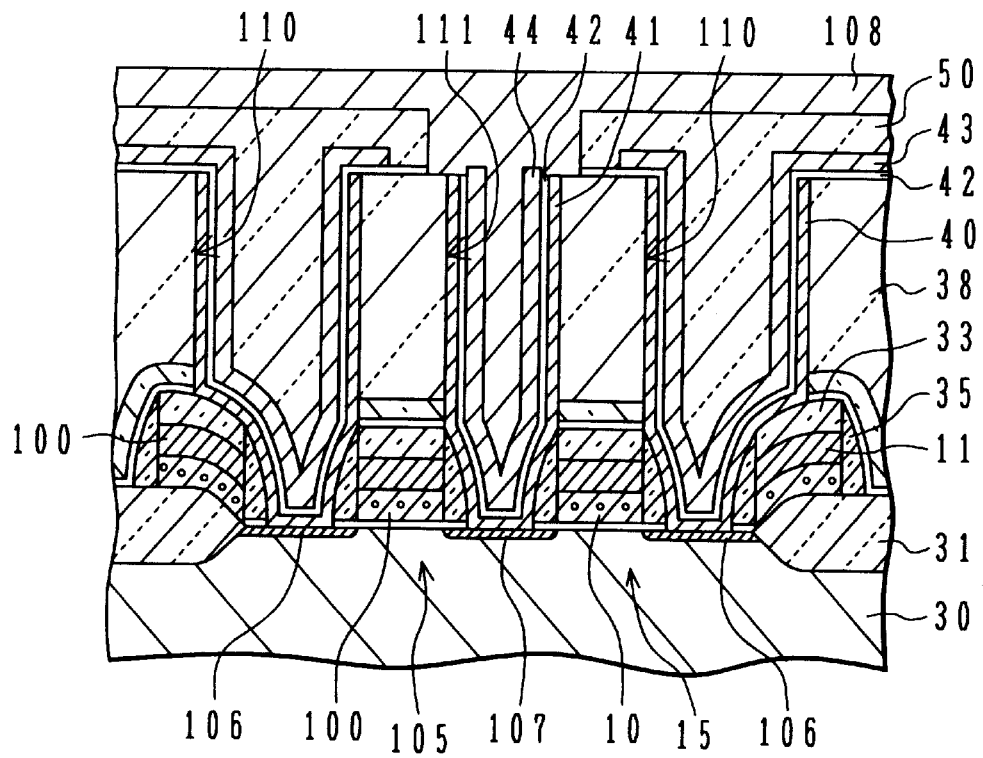

As shown in FIG. 4B, a conductive film is deposited over the whole surface of the substrate and patterned to form a bit line 108. The conductive film is made of Ti/TiN/W (/ means a lower layer/an upper layer). The bit line 108 is therefore connected to the bit region 107 via the amorphous silicon film 41 in the bit contact hole 111.

A MISFET 105 formed has the word line 100 as its gate electrode and the storage region 106 and bit region 107 on both sides of the word line 100 as its source/drain regions. A MISFET 15 formed has the dummy word line 10 as its gate electrode and the storage region 106 and bit region 107 on both sides of the dummy word line 10 as its source/drain regions.

In FIG. 4B, if parts of the upper insulating film 33 and side wall insulating film 35 covering the dummy word line 11 are removed, the dummy word line 11 and storage electrode 40 are shorted. However, in this case, the storage region 106 is in a floating state so that a steady current will not flow between the dummy word line 11 and storage region 106.

Figure 5:
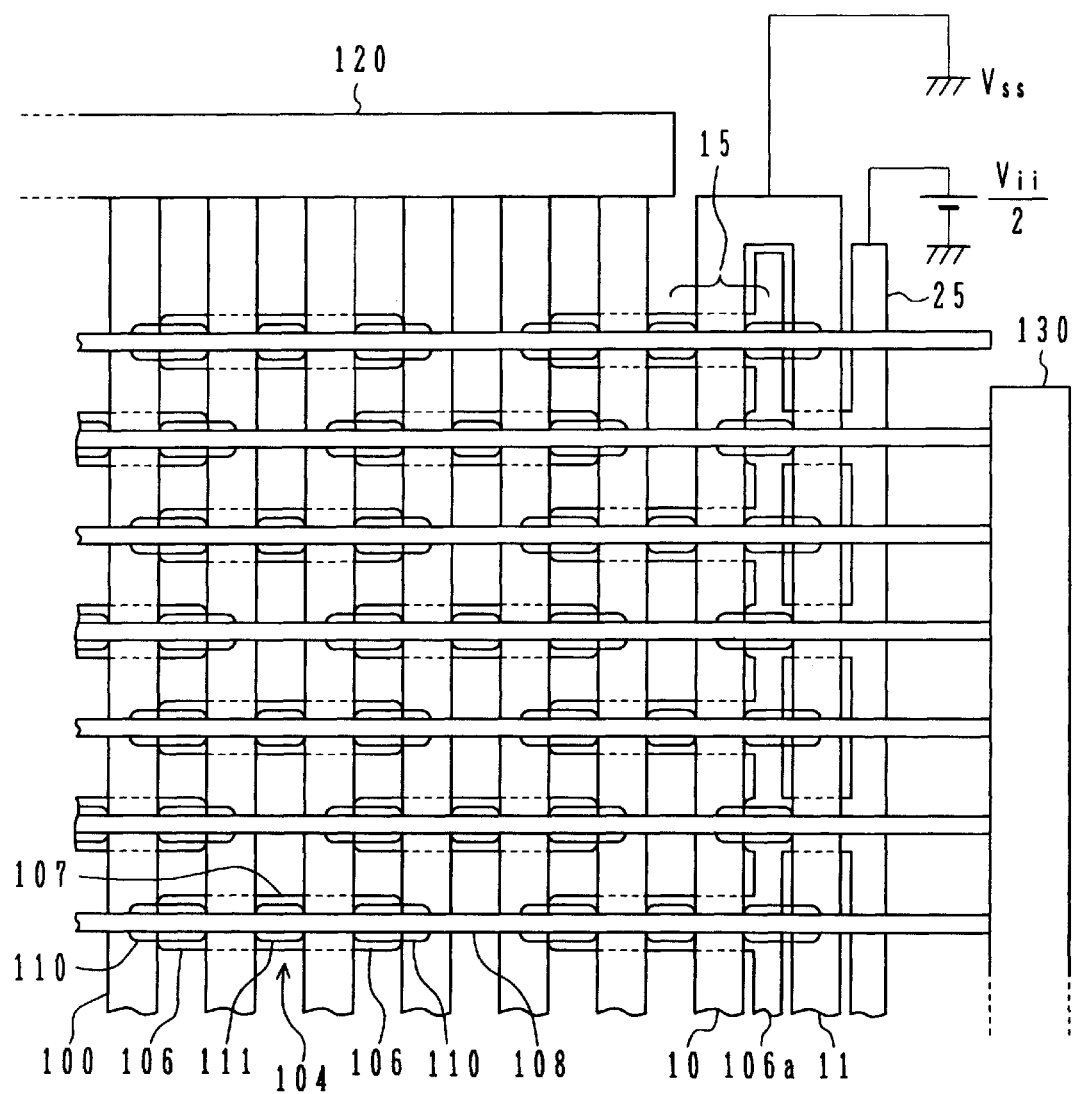
FIG. 5 is a schematic plan view of a semiconductor device according to a second embodiment of the invention.

FIG. 5 is a schematic plan view showing a semiconductor device according to the second embodiment. In the first embodiment shown in FIG. 1, the storage regions 106 between the dummy word lines 10 and 11 are separated. In the second embodiment, the storage regions between the dummy word lines 10 and 11 are connected by an impurity diffusion region 106a formed in the surface layer of the silicon substrate.

Next, with reference to FIGS. 6 and 7, the third embodiment will be described. The bit lines of the semiconductor device of the first embodiment are disposed in a layer higher than the capacitors. In the third embodiment, capacitors are formed in a layer higher than the bit lines.

Figure 6:
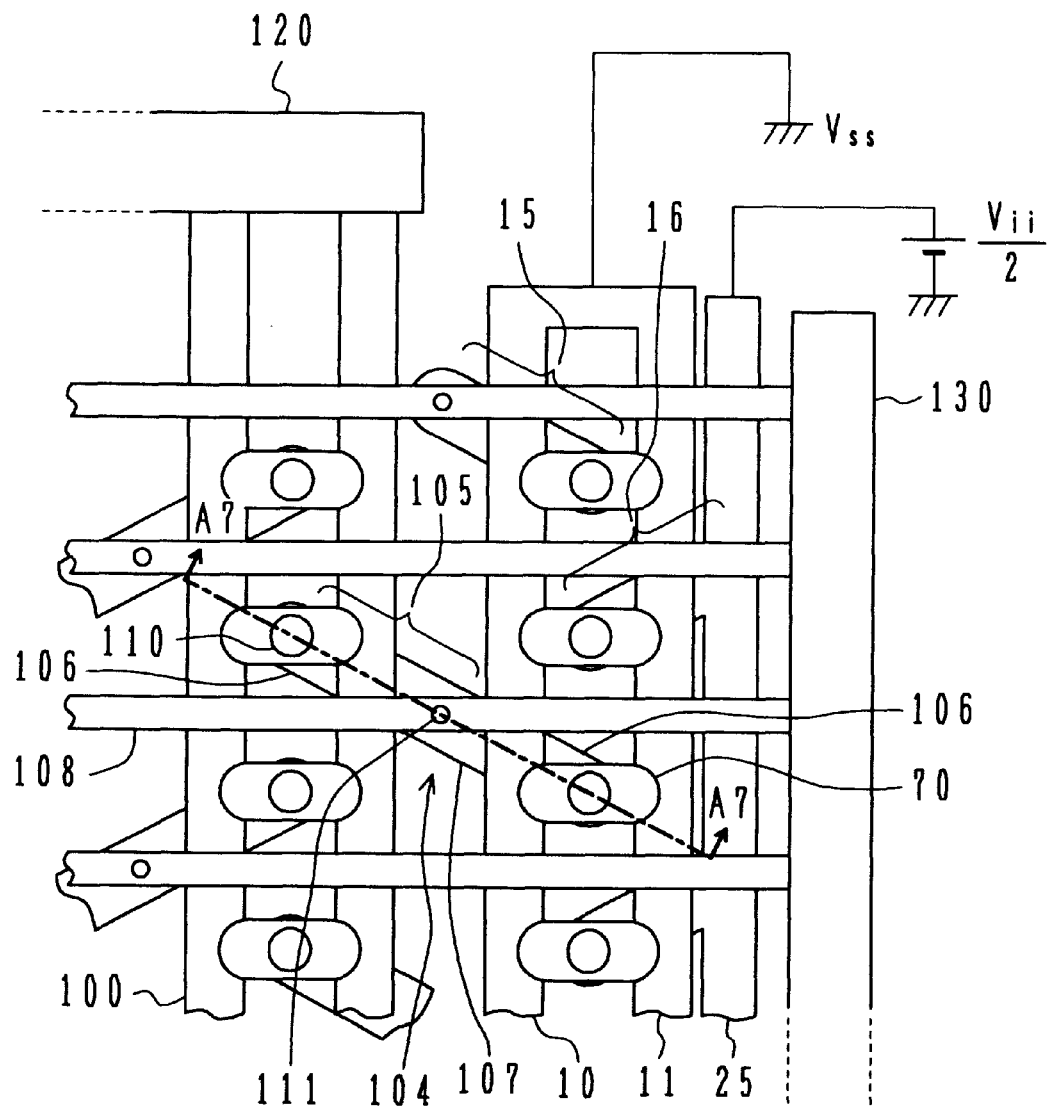
FIG. 6 is a schematic plan view of a semiconductor device according to a third embodiment of the invention.

FIG. 6 is a schematic plan view of a semiconductor device of the third embodiment. In FIG. 6, like elements to those shown in FIG. 1 are represented by using identical reference numerals.

A plurality of word lines 100 are disposed in the column direction in FIG. 6, and a plurality of bit lines 108 are disposed in the row direction. Two dummy word lines 10 and 11 are disposed outside of the outermost word line 100. MISFETs 105 are formed at predetermined cross points between the word and bit lines 100 and 108. MISFETs 15 are formed at predetermined cross points between the dummy word line 10 and bit lines 108, and MISFETs 16 are formed at predetermined cross points between the dummy word line 11 and bit lines 108.

In the first embodiment shown in FIG. 1, since capacitors are formed in a layer lower than the bit line 108, the storage contact hole 110 and bit line 108 partially overlap each other. In the third embodiment, since capacitors are formed in a layer higher than the bit line, the storage contact hole 110 is disposed at the side of the bit line 108. The third embodiment has fundamentally the same layout as the first embodiment, except the positional relation between the storage contact hole 110 and bit line 108.

Figure 7:
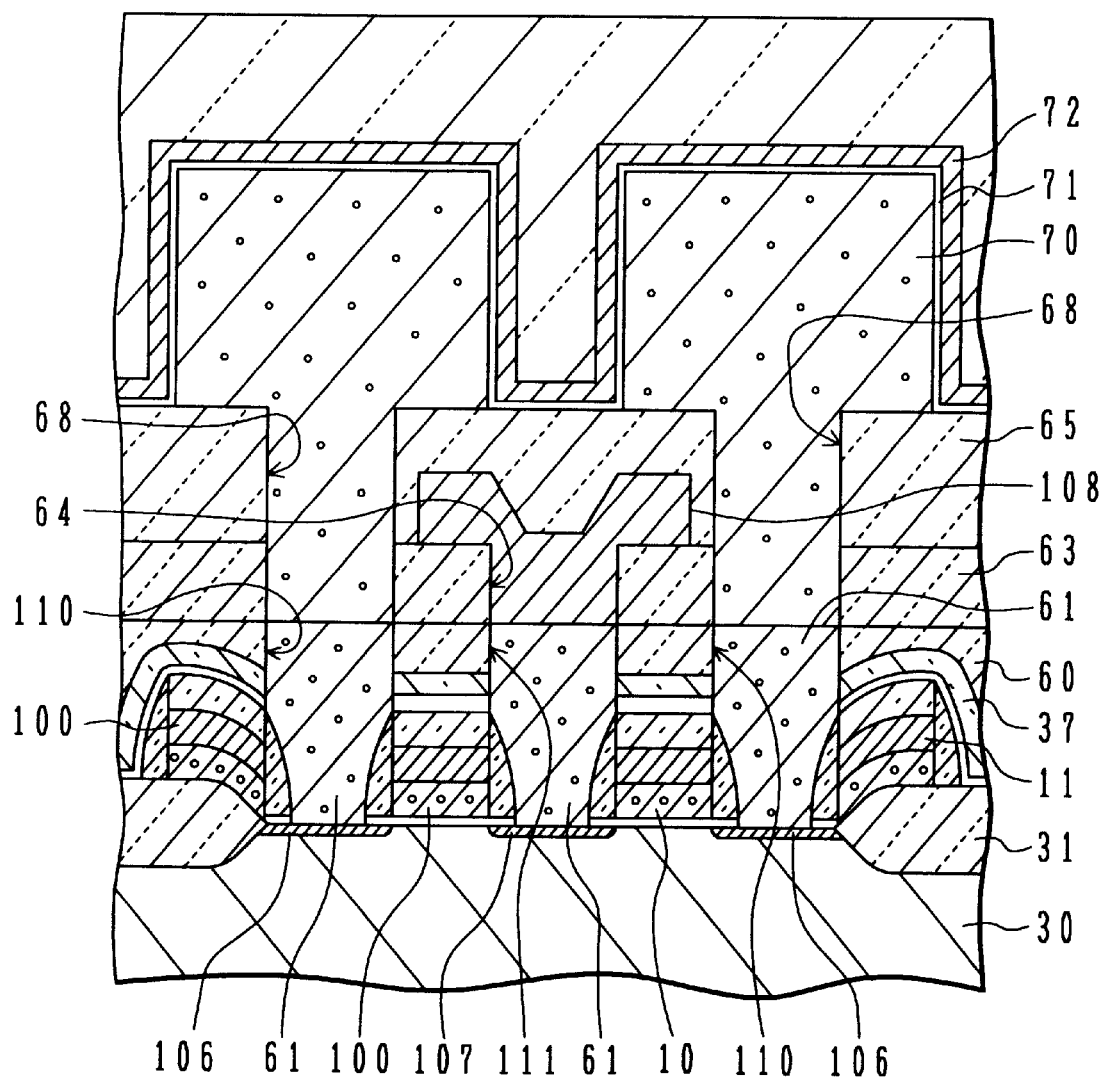
FIG. 7 is a schematic cross sectional view of the semiconductor device taken along one-dot chain line A7—A7 shown in FIG. 6.
Figure 8:
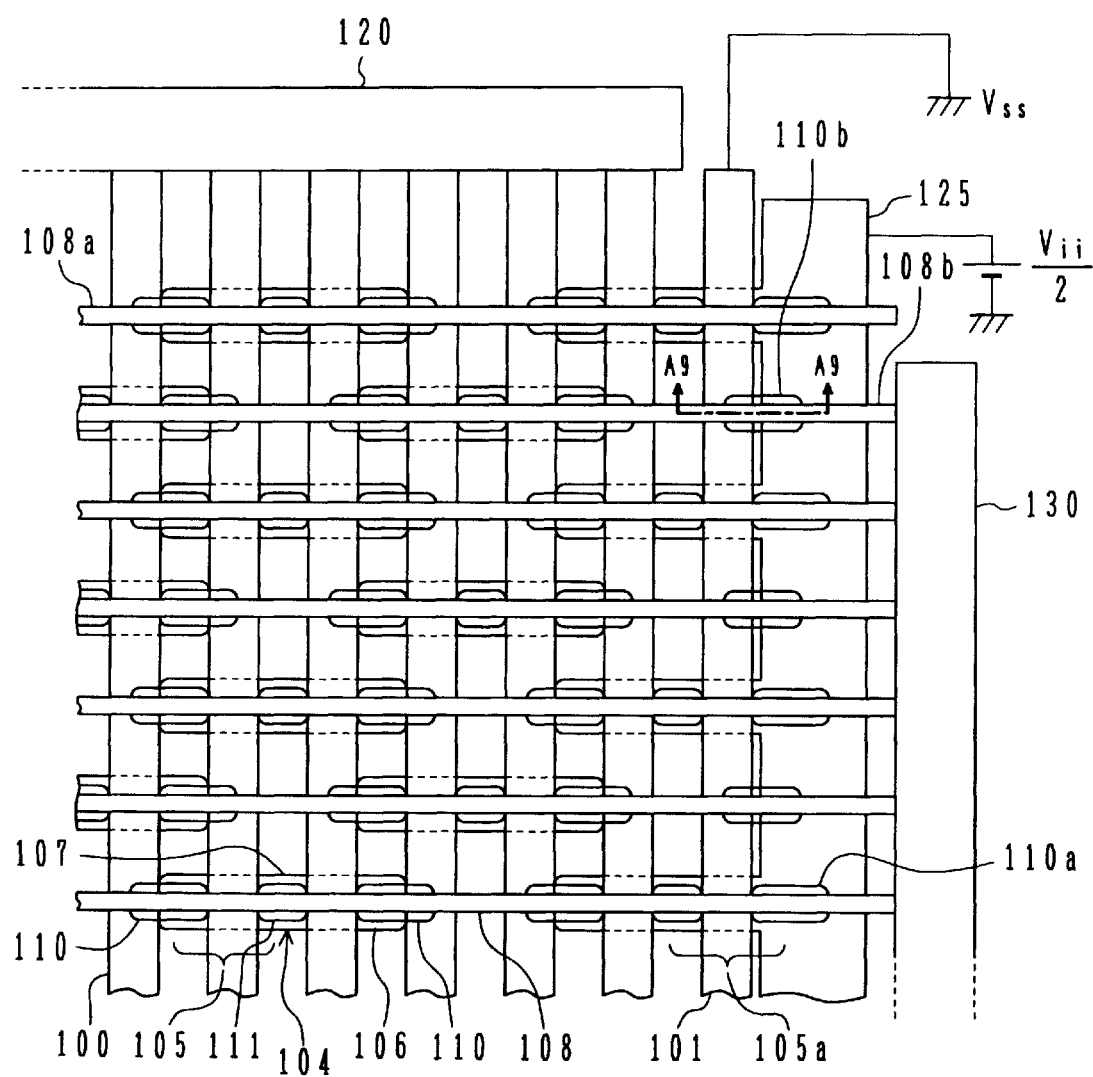
FIG. 8 is a schematic cross sectional view of a conventional semiconductor device.
Figure 9:
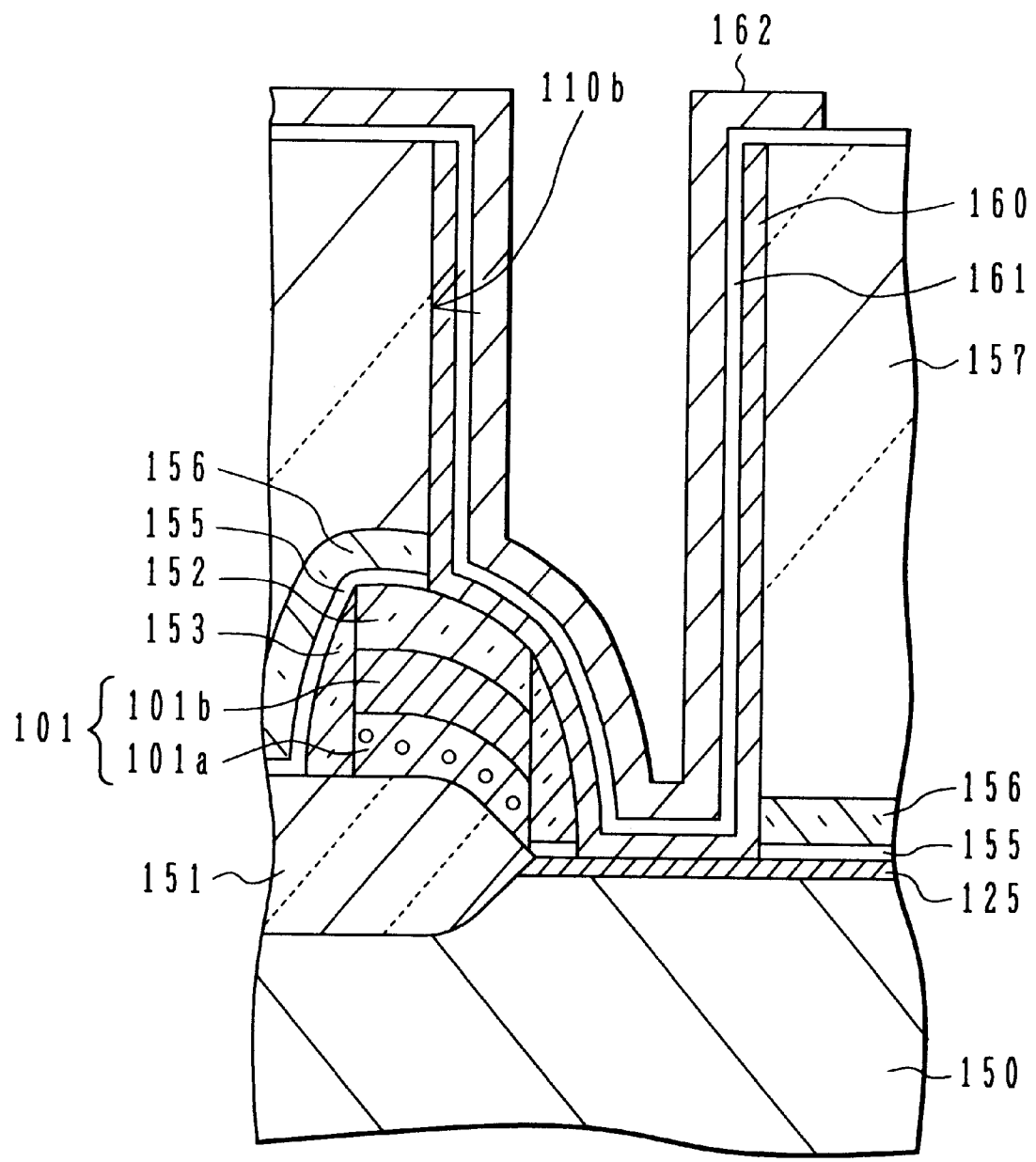
FIG. 9 is a cross sectional view showing a storage contact hole area of the conventional semiconductor device taken along one-dot chain line A9—A9 shown in FIG. 8.

FIG. 7 is a cross sectional view of the semiconductor device taken along one-dot chain line A7—A7 shown in FIG. 6. Processes similar to those of the first embodiment are performed until the etching stopper film 37 is formed as shown in FIG. 2A. The structure lower than the etching stopper film 37 shown in FIG. 7 is therefore formed.

On the etching stopper film 37, an interlayer insulating film 60 made of BPSG and having a thickness of about 0.75 $\mu$m is deposited. The surface of the interlayer insulating film is planarized by CMP. Storage contact holes 110 and a bit contact hole 111 are formed through the interlayer insulating film 50 in areas corresponding to storage regions 106 and a bit region 107. Conductive plugs 61 of polysilicon are embedded in the contact holes 110 and 111.

An interlayer insulating film 63 made of BPSG and having a thickness of about 0.8 $\mu$m is deposited on the interlayer insulating film 60. An opening 64 is formed through the interlayer insulating film 63 in an area corresponding to the bit contact hole 111. A bit line 108 is formed on the interlayer insulating film 63, the bit line 108 embedding the inside of the opening 64 and being connected to the conductive plug 61 in the bit contact hole 111. For example, the bit line 108 is a lamination of a doped amorphous Si film and a $WSi_2$ film. Another interlayer insulating film 65 made of BPSG and having a thickness of about 0.8 $\mu$m is deposited on the interlayer insulating film 63, covering the bit line 108. Openings 68 are formed through the interlayer insulating films 65 and 63 in areas corresponding to the storage contact holes 110. Storage electrodes 70 are formed on the interlayer insulating film 65, filling the insides of the openings 68 and being connected to the conductive plugs 61 in the storage contact holes 110.

A dielectric film 71 made of SiN is deposited on the interlayer insulating film 65, covering the storage electrodes 70. The surface of the dielectric film is thermally oxidized thinly. On the surface of the dielectric film 71, a common electrode 72 made of doped amorphous silicon is formed.

Also in the third embodiment, as shown in FIG. 6, storage regions are disposed only inside of the outer dummy word line 11. It is therefore possible to prevent a short circuit between the outer dummy word line 11 applied with the ground potential Vss and an outermost impurity diffusion region 25 applied with the voltage Vii/2. Since the storage region between the dummy word lines 10 and 11 is in the floating state, a standby current will not flow even if the storage region and dummy word lines 10 and 11 are shorted.

The present invention has been described in connection with the preferred embodiments. The invention is not limited only to the above embodiments. It is apparent that various modifications, improvements, combinations, and the like can be made by those skilled in the art.

What is claimed is:

1. A semiconductor device comprising:
   a semiconductor substrate;
   a plurality of word lines disposed at an interval on a surface of the semiconductor substrate and extending in a first direction;
   at least two dummy word lines disposed at a space and extending in the first direction, the dummy word lines being disposed in an area outside of an outermost word line of the plurality of word lines;

a plurality of MISFETs formed in correspondence with each of the word lines and the dummy word lines and regularly disposed in the first direction and in a second direction crossing the first direction, the word line or dummy word line of each MISFET serving also as a corresponding gate electrode of each MISFET;

an interlayer insulating film covering the MISFETs;

storage contact holes formed through the interlayer insulating film, each being disposed in one storage region among source and drain regions of each MISFET, the storage regions being distributed only in an area inside of an outermost dummy word line among the dummy word lines;

a capacitor formed on a bottom of each storage contact hole in each of the storage regions;

a word driver circuit connected to the word lines for selectively applying an electrical signal to each of the word lines;

a first voltage application circuit for applying a first fixed voltage to the dummy word lines; and a second voltage application circuit for applying a second fixed voltage different from the first fixed voltage to each bit region, disposed outside of the outermost dummy word line, among the source and drain regions of each MISFET corresponding to the outermost dummy word line.

2. A semiconductor device according to claim 1, further comprising an outermost impurity diffusion region disposed outside of the outermost dummy word line in a direction along the dummy word line and formed by doping impurities in a surface layer of the semiconductor substrate, the outermost impurity diffusion region serving as bit regions of a plurality of MISFETs corresponding to the outermost dummy word line.

3. A semiconductor device according to claim 1, wherein the storage regions of the MISFETs corresponding to each of the two dummy word lines are disposed between the two dummy word lines and are made in a d.c. floating state.

4. A semiconductor device according to claim 3, wherein the storage regions of the MISFETs corresponding to each of the two dummy word lines are connected together by an impurity diffusion region in a floating state formed in a surface layer of the semiconductor substrate.

5. A semiconductor device according to claim 1, wherein each of the storage contact holes formed in correspondence with the storage regions of the MISFETs corresponding to each of the two dummy word lines partially overlaps at least one of the two dummy word lines as viewed along a direction normal to the semiconductor substrate.

6. A semiconductor device according to claim 1, further comprising a plurality of bit lines formed on the surface of the semiconductor substrate and extending in the second direction, the bit lines being disposed in correspondence with the MISFETs disposed in the first direction and connected to bit regions of the corresponding MISFETs.

7. A semiconductor device according to claim 6, further comprising a sense amplifier circuit connected to the bit lines for detecting a voltage on each bit line, the sense amplifier circuit being disposed outside of the bit regions corresponding to the outermost dummy word line.

8. A semiconductor device according to claim 7, wherein an outermost bit line among the bit lines is not connected to the sense amplifier circuit.

9. A semiconductor device according to claim 1, further comprising an etching stopper film formed under the interlayer insulating film, the etching stopper film covering surfaces of the dummy word lines and made of material having a different etching resistance from material of the interlayer insulating film.

* * * * *